United States Patent
Chen et al.

(10) Patent No.: US 8,418,117 B2
(45) Date of Patent: Apr. 9, 2013

(54) CHIP-LEVEL ECO SHRINK

(75) Inventors: Huang-Yu Chen, Zhudong Township (TW); Ho Che Yu, Zhubei (TW); Chung-Hsing Wang, Baoshan Township (TW); Hsiao-Shu Chao, Baoshan Township (TW); Yi-Kan Cheng, Taipei (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 351 days.

(21) Appl. No.: 12/831,982

(22) Filed: Jul. 7, 2010

(65) Prior Publication Data
US 2011/0072405 A1 Mar. 24, 2011

Related U.S. Application Data

(60) Provisional application No. 61/243,878, filed on Sep. 18, 2009.

(51) Int. Cl.
*G06F 17/50* (2006.01)

(52) U.S. Cl. .......................... 716/132; 716/119; 716/122
(58) Field of Classification Search .................. None
See application file for complete search history.

(56) References Cited

U.S. PATENT DOCUMENTS

| | | | |
|---|---|---|---|
| 5,477,467 A | 12/1995 | Rugg | |
| 5,493,510 A | 2/1996 | Shikata | |
| 6,453,445 B1 | 9/2002 | Kuhn et al. | |
| 7,640,520 B2 * | 12/2009 | Wang et al. | 716/132 |

* cited by examiner

*Primary Examiner* — Leigh Garbowski
(74) *Attorney, Agent, or Firm* — Slater & Matsil, L.L.P

(57) ABSTRACT

In a method of forming an integrated circuit, a layout of a chip representation including a first intellectual property (IP) is provided. Cut lines that overlap, and extend out from, edges of the first IP, are generated. The cut lines divide the chip representation into a plurality of circuit regions. The plurality of circuit regions are shifted outward with relative to a position of the first IP to generate a space. The first IP is blown out into the space to generate a blown IP. A direct shrink is then performed.

26 Claims, 9 Drawing Sheets

CHIP-LEVEL ECO SHRINK

This application claims the benefit of U.S. Provisional Application No. 61/243,878 filed on Sep. 18, 2009, entitled "Chip-Level ECO Shrink," which application is hereby incorporated herein by reference.

CROSS-REFERENCE TO RELATED APPLICATION

This application relates to commonly-assigned U.S. patent application Ser. No. 11/807,640, filed May 30, 2007, and entitled "Design Flow for Shrinking Circuits Having Non-Shrinkable IP Layout," which application is hereby incorporated herein by reference.

TECHNICAL FIELD

This invention relates generally to the design and manufacturing of integrated circuits, and more particularly to the shrinking of integrated circuits between different technology generations.

BACKGROUND

In order to incorporate more functions and achieve better performance and lower cost, integrated circuits are formed with increasingly smaller dimensions. However, there are legacy circuits that have already been designed with greater dimensions. It is not cost effective to redesign these circuits for smaller dimensions, although the legacy circuits' design layout may be shrunk and then implemented on silicon wafers.

Since the performances of integrated circuits are often related to their sizes, some integrated circuits are preferably not shrunk. For example, analog circuits and some high-speed integrated circuits need to keep their original sizes in order to maintain their performance unchanged throughout different generations of integrated circuits. This creates a dilemma. Since these non-shrinkable integrated circuits are often integrated in the same semiconductor chips as shrinkable integrated circuits, whose performances are not affected by their dimensions, the integrated circuits on a semiconductor chip may not be able to be shrunk uniformly. Instead, efforts are needed to shrink only the shrinkable circuits, while keeping the non-shrinkable circuits intact.

To achieve this goal, the layout of the non-shrinkable circuits may be blown up (magnified) first. An abstract may then be generated from the blown-up layout of the non-shrinkable circuits. The blown-up layout and the respective abstract are then merged with the layout and the abstract of shrinkable circuit layouts to generate a new integrated circuit. Foundries can then shrink the new integrated circuit to a same scale as to which the layout of the non-shrinkable circuit was magnified. Accordingly, the layout of the non-shrinkable circuits is restored back to the original size, while the shrinkable circuits are shrunk.

The conventional methods for shrinking integrated circuits suffer from drawbacks, however. First, there is no flexibility in the handling of the shrinking. Basically, only two types of circuits can be handled in conventional methods, including the circuits that will not be shrunk and all other circuits that will be shrunk at a same ratio. If circuits in a same chip need to be shrunk with different ratios, the conventional methods cannot handle them. Second, after the non-shrinkable circuit is blown up, if it is so large that it has to overlap surrounding circuits, errors may occur, and no solution to such an error scenario has been provided.

SUMMARY

In accordance with one aspect of the disclosure, a method of forming an integrated circuit includes providing a layout of a chip representation including a first intellectual property (IP). Cut lines that overlap and extend out from edges of the first IP are generated. The cut lines divide the chip representation into a plurality of circuit regions. The plurality of circuit regions are shifted outward relative to a position of the first IP to generate a space. The first IP is blown out into the space to generate a blown IP. A direct shrink is then performed.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
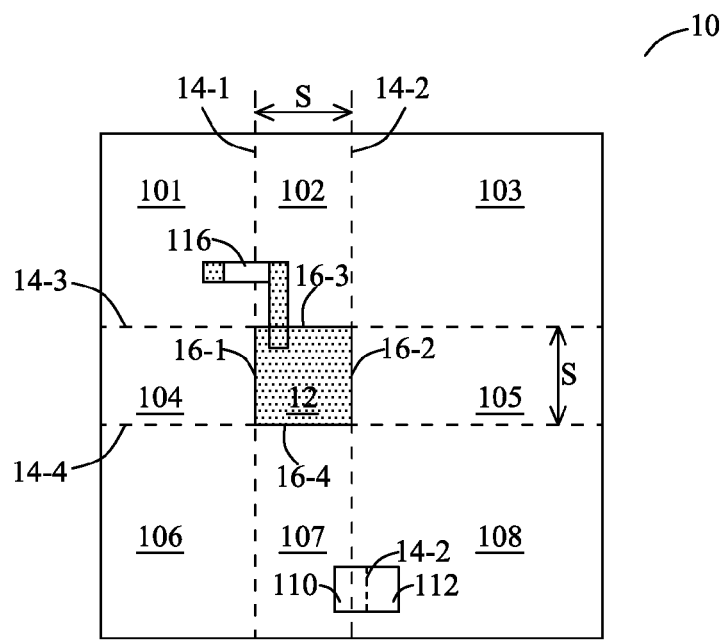
FIGS. 1 through 3 illustrate a first embodiment including one intellectual property (IP) in a chip representation.

The making and using of the illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel method for shrinking layouts of integrated circuits is presented. The intermediate stages of an illustrative embodiment are illustrated. The variations of the embodiment are then discussed. Throughout the various views and illustrative embodiments like reference numbers are used to designate like elements.

It is realized that at the time the layouts are shrunk, the physical circuits represented by the layouts have not been made yet, and the shrinking is performed on the layout patterns. Accordingly, the layouts are also referred to as an integrated circuit representation. The subsequently discussed shrinking steps may be started from a chip representation (also denoted using the same reference numeral as the chip) that represents the physical chip, on which the final layout will be implemented. The original layouts before shrinking and the final layouts after shrinking may be stored in a storage media, which may be a hard drive of a computer, a tape, a disk, or the like. Further, certain steps discussed in subsequent paragraphs may be performed by a computer. The layouts may be implemented on lithography masks, and then implemented on semiconductor chips using the lithography masks. Accordingly, the layouts also represent the lithography masks and physical chips. In subsequent paragraphs, the term "chip" and "chip representation" are alternatively used.

Figure 2:
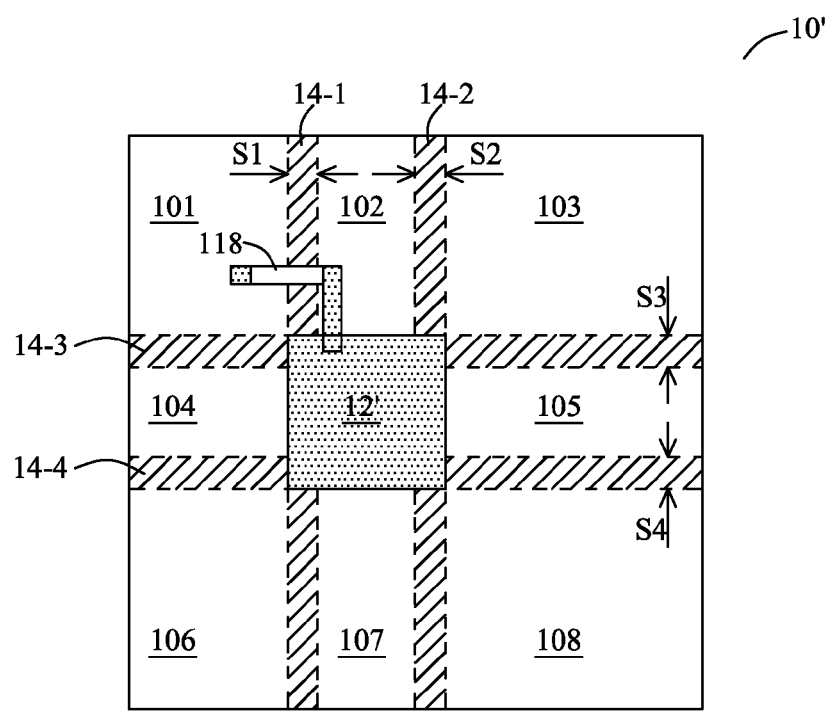
Figure 3:
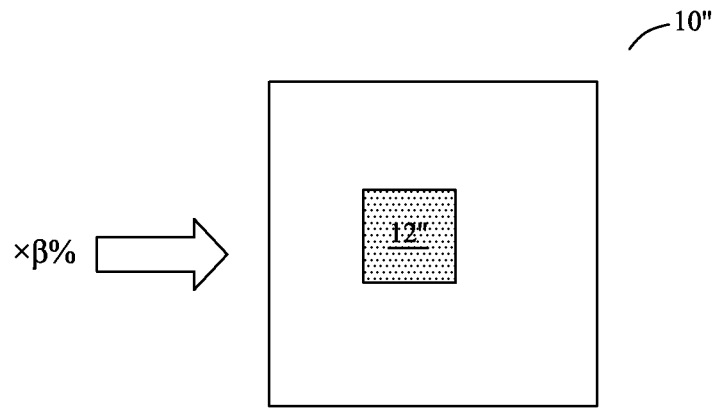

FIGS. 1 through 3 illustrate a first embodiment. Referring to FIG. 1, chip representation 10 includes intellectual property (IP) 12, which is the layout of a circuit comprising integrated circuit devices. For simplicity, the detailed layout of IP 12 and other circuits in chip representation 10 are not illustrated. The size of the entire chip representation 10 is to be shrunk to β% (refer to FIG. 3) of the original size. However, IP 12 is to be shrunk (if at all) to ratio γ%, which may be different from β%. Ratio γ% may actually be equal to 100%, greater than 100%, between β% and 100%, or even less than β%.

IP 12 has four edges 16 (denoted as 16-1, 16-2, 16-3, and 16-4). Cut lines 14 (denoted as 14-1, 14-2, 14-3, and 14-4) are made overlapping and extending from edges 16. Cut lines 14 preferably, if possible, extend to the edges of chip representation 10. Cut lines 14 divide chip representation 10 into eight regions, namely regions 101 through 108, each being a circuit region. If one of cut lines 14 happens to cut a standard cell (not shown) into two, the respective cut line may detour slightly to overlap a boundary of the standard cell. For example, FIG. 1 illustrates that if cut line 14-2 happens to cut through standard cell 110 (as illustrated in FIG. 1), cut line 14-2 may detour to the right and overlapping the interface between standard cells 110 and 112.

The widths of cut lines 14 as shown in FIG. 1 are negligible (or having no width). In FIG. 2, the widths of cut lines 14 are expanded to widths S1, S2, S3, and S4. As a result, chip representation 10 is enlarged to chip representation 10'. In an embodiment, width S1 is equal to width S2, and/or width S3 is equal to width S4. In alternative embodiments, width S1 may not be equal to width S2, and/or width S3 may not be equal to width S4. Further, one of width S1 and S2 may be equal to zero (which means that the corresponding cut lines are not widened), and/or one of widths S3 and S4 may be equal to zero. It is noted that after the widening of cut lines 14 is equivalent to shifting circuit regions 101 through 108 outward (relative to the position of IP 12). However, the sizes of circuit regions 101 through 108 are the same as in the original circuit as shown in FIG. 1. The internal layouts of circuits 101 through 108 also stay the same. Further, the topology of circuit regions 101 through 108 (sometimes also referred to herein as simply circuits to recognize the fact that these regions are ultimately implemented in physical integrated circuits), which means the relative positions of circuits 101 through 108, stays the same. For example, circuit 103 is still on the topside of circuit 105, and circuit 108 is still on the right side of circuit 107. Preserving the topology makes the routing of metal lines between circuits much easier. For example, the metal line 116 in FIG. 1 may simply be extended to generate metal line 118 (FIG. 2), and the circuits affected by the shift may hence be connected correctly without further redesign.

Since the widening of cut lines 14 leaves more space for IP 12, IP 12 can be blown up to generate blown IP 12', which means that all the circuits and layout patterns in IP 12 are increased by a same ratio, for example, to α% of the original size. The edges of blown IP 12' may overlap the outer edges (the edges on the opposite side of original IP 12) of cut lines 14.

Referring to FIG. 3, a direct shrink is performed, and the entire layout of chip representation 10' (including blown IP 12') as shown in FIG. 2 is shrunk by factor β%. The resulting chip representation is denoted as 10". After being shrunk, blown IP 12' becomes final IP 12". The size of final IP 12" is shrunk to γ% of the original size of IP 12 as shown in FIG. 1. Therefore, both the shrinking requirement of chip representation 10 and IP 12 may be satisfied. To ensure that the size of final IP 12" is γ% of the original size of IP 12, the following equation may be satisfied:

$$[(S+S1+S2)/S]*\beta\% = \gamma\% \qquad [\text{Eq. 1}]$$

wherein S is an original length (refer to FIG. 1) of IP 12. The desirable value of (S1+S2) may be calculated from Equation 1, while the individual values of widths S1 and S2 may be selected by designers. In an embodiment, the final layout as shown in FIG. 3 is generated and stored in the storage media for future use. In alternative embodiments, the direct shrink is performed optically by generating a lithography mask for the layout as shown in FIG. 2, and shrinking the layout at the time of exposure of photo resists using the lithography mask.

Figure 4:
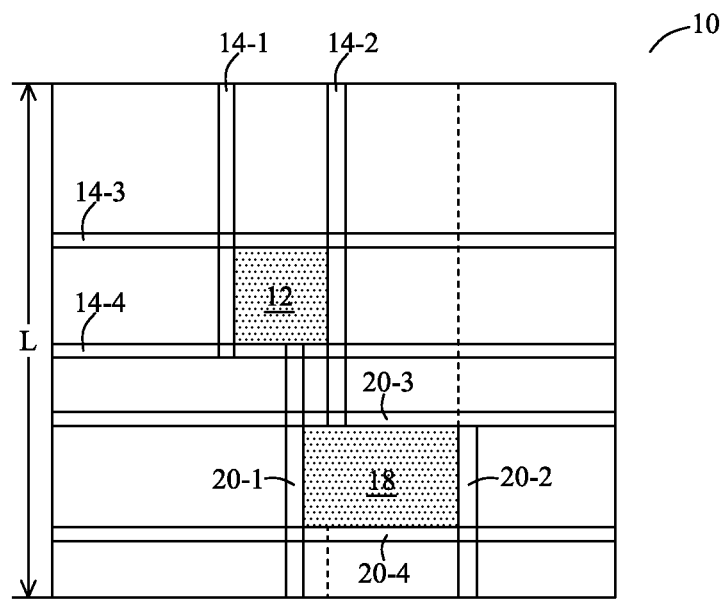
FIGS. 4 through 6 illustrate the handling of two IPs in a chip representation.
Figure 5:
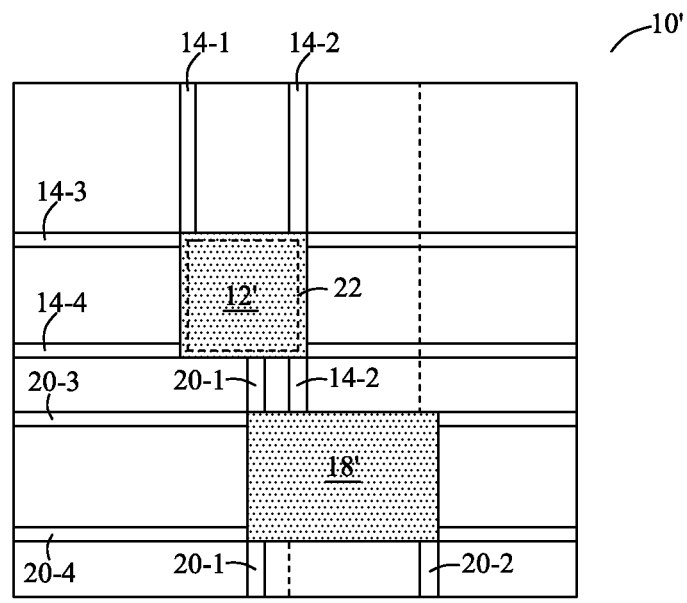
Figure 6:
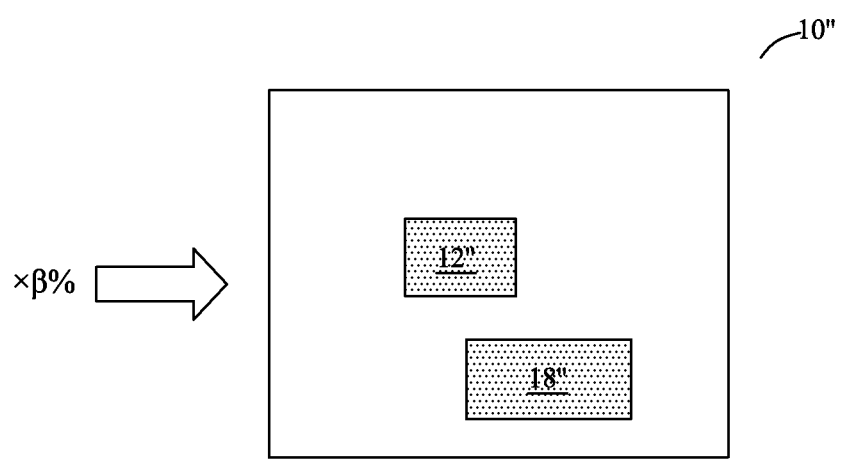

If there are more than one IP in a chip needing to be shrunk to a different ratio than the ratio of the whole chip, the above-described process as shown in FIG. 2 may be repeated for each of the IPs, and after the process is repeated for all of the IPs, a direct shrink as shown in FIG. 3 is performed. However, situation may arise that the cut lines of one IP cross another IP. An illustrative solution for this case is shown in FIGS. 4 through 6. Referring to FIG. 4, chip representation 10 includes IPs 12 and 18. Cut lines 14 (denoted as 14-1 through 14-4) and 20 (denoted as 20-1 through 20-4) are then made by overlying edges of IPs 12 and 18, respectively, and widening cut lines 14 and 20 to desirable widths. However, if any of the cut lines, such as cut lines 14-2 and 20-1 run into another IP, the cut line ends at the corresponding edges of the other IP. Further, cut line 14-1 also only extends downward to the level of cut line 14-4. In other words, each of cut lines 14-1 and 20-1 does not extend the full length L of chip representation 10. However, cut lines 14-1 and 20-1 in combination expand to the full length L of chip representation 10, and hence may be considered as portions of a same cut line. It can also be considered that the full-length cut line representing cut lines 14-1 and 20-1 detours and does not form a straight line. In other words, IPs 12 and 18 share a same cut line that is formed of cut lines 14-1 and 20-1. Accordingly, the width of cut line 14-1 may be equal to the width of cut line 20-1. Similarly, IPs 12 and 18 share a same cut line including portions 14-2 and 20-2. By sharing a cut line between vertically overlapped IPs 12 and 18, the topology of other circuits separated by the cut lines may be maintained. Similarly, a cut line may be shared amongst horizontally overlapped IPs. It is realized that "vertical" and "horizontal" are relative concepts, and may exchange if chip representation 10 is placed in a different orientation.

Referring to FIG. 5, both IPs 12 and 18 are blown up to generate blown IPs 12' and 18', respectively. In this case, IPs 12 and 18 may be blown up to different ratios. The requirement of the widths of the widened cut lines 14 and 20 may be determined based on the requirement of the specific IPs. It is noted that an IP does not have to be blown up to the outer edges of the respective cut lines. For example, dotted rectangle 22 illustrates the boundary of a possible IP blown up from IP 12. Next, FIG. 6 illustrates the layout of chip representation 10" obtained as a result of a direct shrink, in which the layout shown in FIG. 5 is shrunk to β% of the original size. The resulting IPs are shown as IPs 12" and 18".

Figure 7:
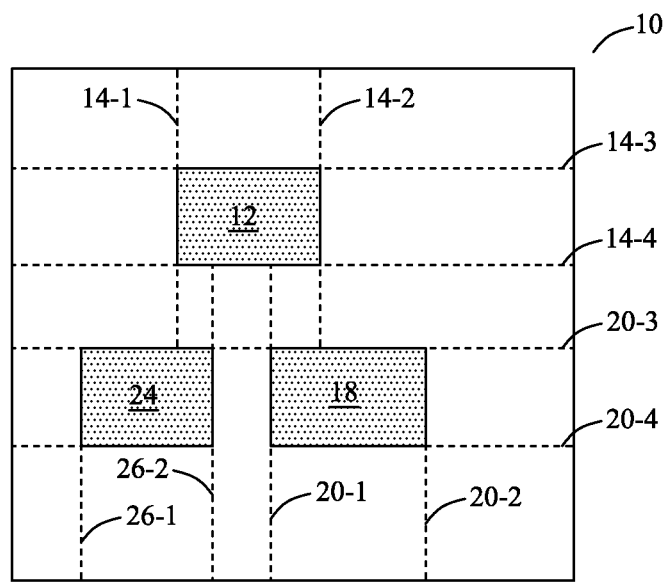
FIGS. 7 through 9 illustrate the handling of three IPs in a chip representation.
Figure 8:
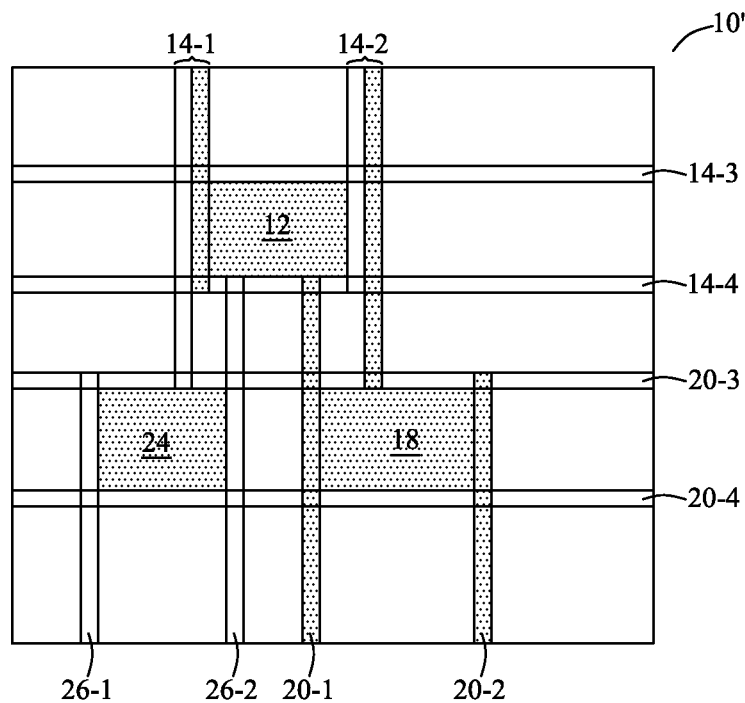
Figure 9:
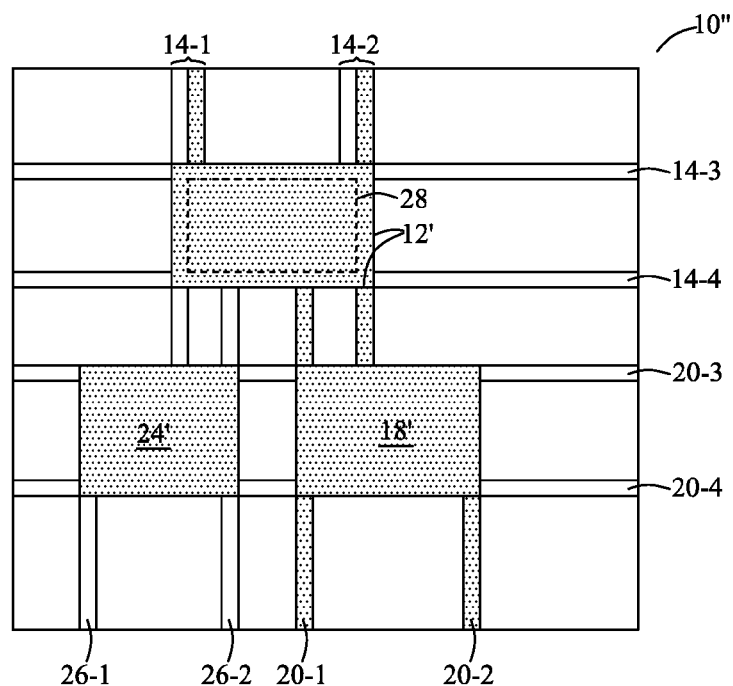

The concept of sharing IP may be used to solve the case including more than two IPs, as shown in FIGS. 7 through 9. Referring to FIG. 7, chip representation 10 includes IPs 12, 18 and 24, wherein IPs 18 and 24 are in the same horizontal location. Cut lines 14, 20, and 26 are generated for IPs 12, 18, and 24, respectively. Similarly, as described in FIG. 5, cut lines 14, 20, and 26 will stop when they run into another IP. Cut lines 14-1, 20-1, and 26-1, which are all on the left side of the respective IPs, may be shared by IPs 12, 18, and 24. Similarly, cut lines 14-2, 20-2, and 26-2, which are all on the right side of the respective IPs, are also shared by IPs 12, 18, and 24.

FIG. 8 illustrates the widening of cut lines 14, 20, and 26 to generate a layout in chip representation 10'. After the widening of cut lines 14, 20, and 26, the width of the widened cut line 14-1 may be equal to the sum of the widths of the widened cut lines 20-1 and 26-1, and the width of the widened cut line 14-2 may be equal to the sum of the widths of the widened cut lines 20-2 and 26-2. The details for widening cut lines have been discussed in preceding paragraphs, and hence are not repeated herein. The widths of cut lines 14, 20, and 26 are determined by the desired ratio final shrinking ratio of the respective IPs 12, 18, and 24, wherein Equation 1 may be referenced in the determination of the widths of cut lines 14, 20, and 26.

In FIG. 9, IPs 12, 18, and 24 are blown up to desired ratios, which ratios do not have to, although they can be, equal to each other. The resulting blown IPs are denoted as 12', 18', and 24', respectively. After the layout as shown in FIG. 9 is made, a direct shrink may be performed to shrink the layout of the respective representation 10'' as shown in FIG. 9 to a desired ratio. Again, in the step shown in FIG. 9, any of the IPs 12, 18 and 24 does not have to be blown up to overlap the outer edges of the respective widened cut lines. For example, dotted lines 28 illustrate the boundary of a possible blown IP blown up from IP 12, which blown IP is smaller than blown IP 12'.

Figure 10:
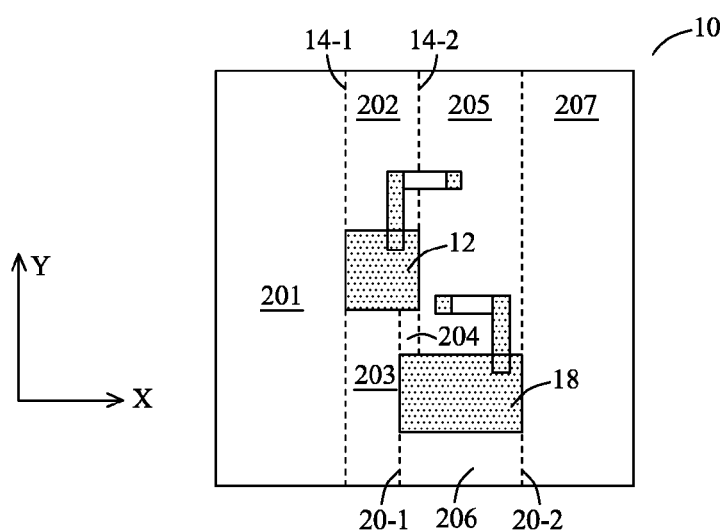
FIGS. 10 through 16 illustrate an alternative embodiment.

FIGS. 10 through 16 illustrate an alternative embodiment. Referring to FIG. 10, chip representation 10 includes IPs 12 and 18. Cut lines 14-1, 14-2, 20-1, and 20-2 are then formed extending in a same direction, for example, Y-direction in FIG. 10. Cut lines 14-2 and 20-1 run into IPs 18 and 12, respectively, and hence are terminated where they meet IPs 18 and 12, respectively. Cut lines 14-1, 14-2, 20-1, and 20-2 divide chip representation 10 into circuit regions 201, 202, 203, 204, 205, 206, and 207.

Figure 11:
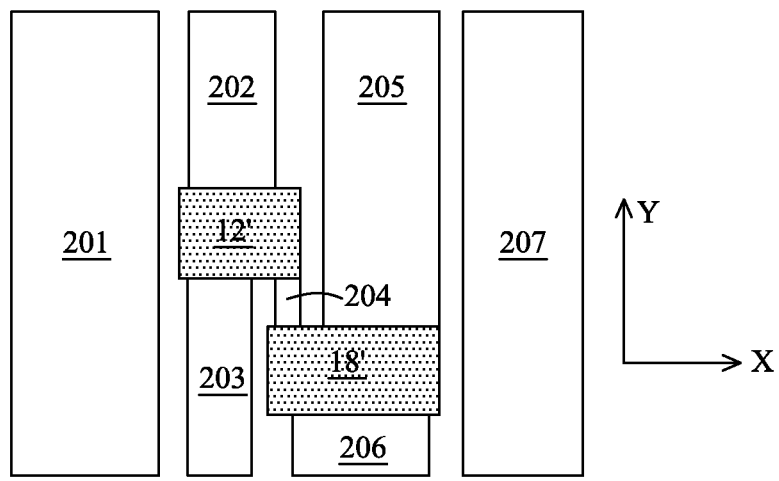

FIG. 11 illustrates that IPs 12 and 18 are blown up in the X-direction, but not in the Y-direction, generating blown IPs 12' and 18', respectively. The blown up ratios of IPs 12 and 18 may be the same as, or different from, each other. FIG. 11 further illustrates circuit regions 201, 202, 203, 204, 205, 206, and 207 as separate regions for a clear view, wherein the illustrated regions are loosely placed with gaps therebetween. Comparing FIGS. 10 and 11, it is noted that circuit regions 201 through 207 as shown in FIG. 11 are shifted in the negative X-direction (but not in the Y-direction), so that none of circuit regions 201 through 207 and the blown IPs 12' and 18' overlap each other.

Figure 12:
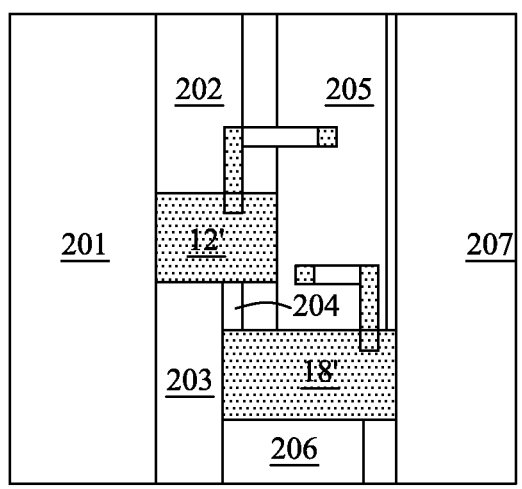

Referring to FIG. 12, a compaction is performed to compact blown IPs 12' and 18' and circuit regions 201 through 207 in the X-direction. In an embodiment, the compaction is performed so that all regions are compacted to the left until their left edges join right edges of the circuits/IPs on their left. In an exemplary embodiment, circuit region 201 is used as a reference, and blown IP 12' and circuit regions 202 and 203 are compacted to the left. Next, regions 204, 205, and 206 and blown IP 18' are compacted to the left. Finally, circuit region 207 is compacted to the left, resulting in the layout pattern as shown in FIG. 12. In alternative embodiments, the compaction may be performed to the right using circuit region 207 as a reference.

Figure 13:
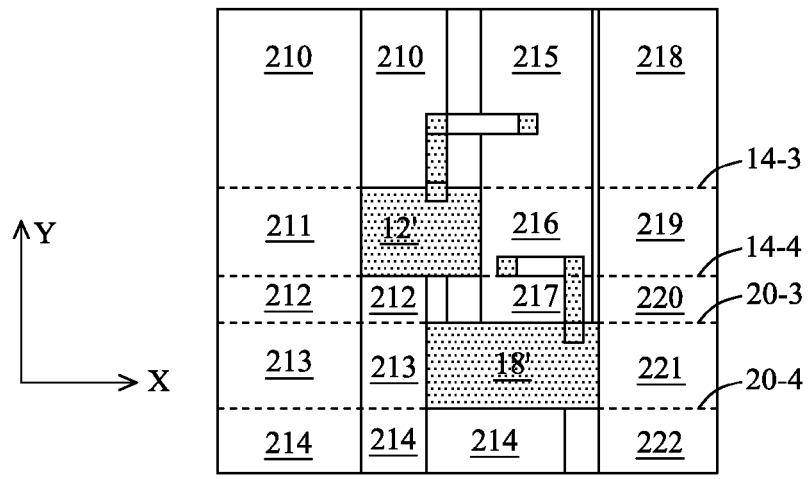
Figure 14:
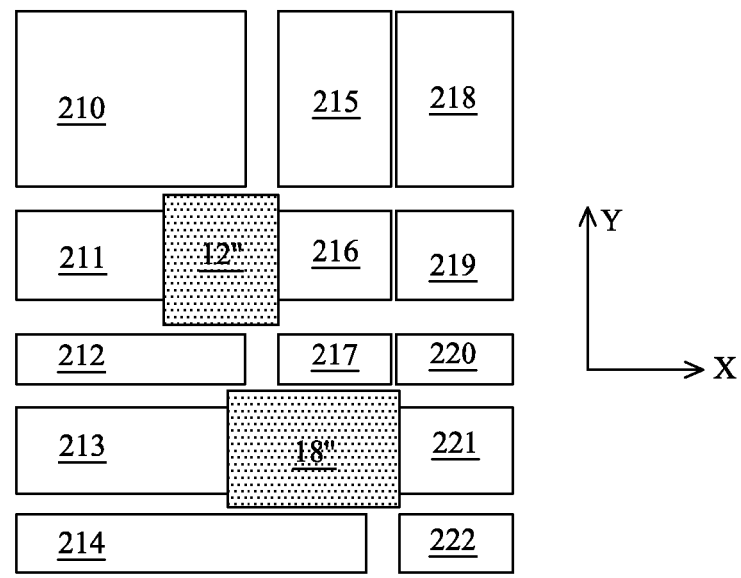

Next, as shown in FIG. 13, cut lines 14-3, 14-4, 20-3, and 20-4 are generated and extended in the X-direction. Since none of these cut lines run into any IPs, they may extend across all the way from one edge of the respective chip representation to the opposite edge. Referring to FIG. 14, cut lines 14-3, 14-4, 20-3, and 20-4 further divide the compacted chip as shown in FIG. 12 into circuit regions 210 through 222. FIG. 14 further illustrates that blown IPs 12' and 18' are further blown up in the Y-direction, but not in the X-direction, to desired ratios, and hence blown IPs 12'' and 18'' are generated. Circuit regions 210 through 222 are illustrated as separate regions for a clear view, with regions 210 through 222 loosely spaced apart in the Y-direction. Comparing FIGS. 13 and 14, it is noted that circuit regions 210 through 222 as shown in FIG. 13 are shifted in the Y-direction (but not in the X-direction), so that none of circuit regions 210 through 222 and the blown IPs 12'' and 18'' overlap each other. Please note that cut lines 14-3, 14-4, 20-3, and 20-4 will re-divide regions. For example, region 214 includes portions of the original regions 201, 203, and 206 as in FIG. 12. After the compaction, described below, the original wires are reconnected.

Figure 15:
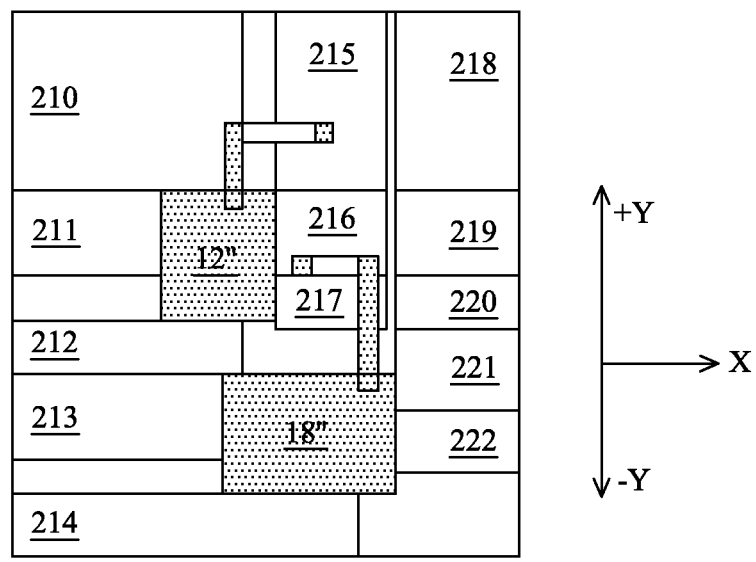
Figure 16:
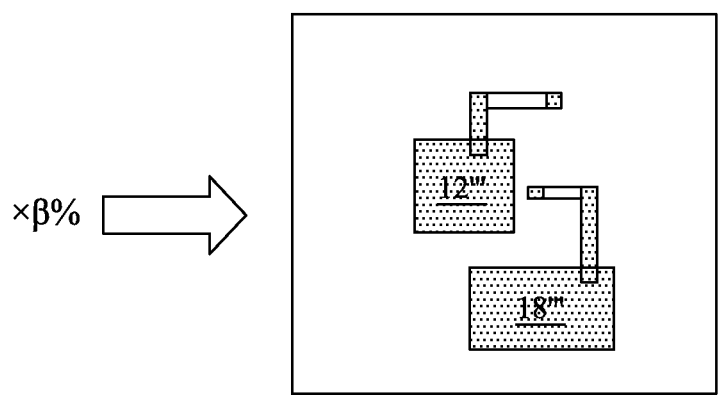

Referring to FIG. 15, a compaction is performed to compact blown IPs 12'' and 18'' and circuit regions 210 through 222 in the Y-direction. In an embodiment, the compaction is made so that all regions are compacted in the +Y direction. For example, circuit regions 210, 215 and 218 are used as a reference, and blown IP 12'' and circuit regions 211, 216, and 219 are compacted to the top. Next, regions 212, 217, and 220 are compacted to the top. Circuit regions 213 and 221 and blown IP 18'' are then compacted. Finally, circuit regions 214 and 222 are compacted to the top, resulting in the layout pattern as shown in FIG. 15. In alternative embodiments, the compaction may be performed to the bottom (−Y direction). The original wires are reconnected after the compaction. A direct shrink is then performed, resulting in the layout as shown in FIG. 16, wherein blown IPs 12'' and 18'' are shrunk to form IPs 12''' and 18''', respectively.

Figure 17:
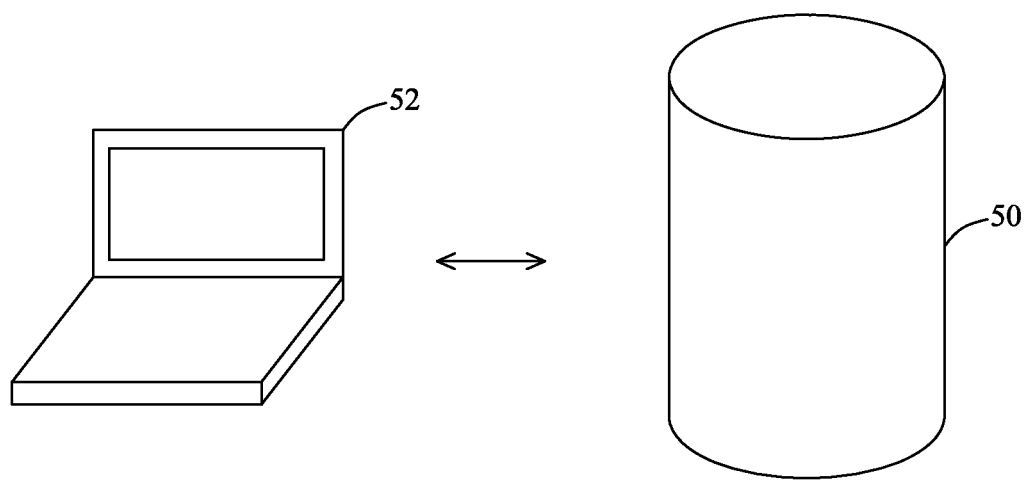
FIG. 17 illustrates a computer for performing the layout shrinking and a storage media for storing layouts.

Referring to FIG. 17, in the embodiments discussed in the preceding paragraphs, the layouts as discussed in preceding paragraphs may be stored in storage media 50, which may be a hard drive, a tape, a disk, or the like. The steps discussed in preceding paragraphs such as blowing up, shrinking, and shifting layout patterns may be performed by computer 52, which accesses the storage media 50 to retrieve the original layouts, and to save the intermediate layouts and final layouts into storage media 50 or a separate storage media. Computer 52 may execute program codes, which may also be stored in a storage media, to perform these steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit, the method comprising:

providing a first layout of a chip representation comprising a first intellectual property (IP);
generating cut lines overlapping, and extending out from, edges of the first IP, wherein the cut lines divide the chip representation into a first plurality of circuit regions;
shifting the plurality of circuit regions outward relative to a position of the first IP, wherein a space is generated by the step of the shifting; and
blowing up the first IP into the space to generate a first blown IP, wherein the first IP is blown up by a first ratio, wherein the step of blowing up the first IP is performed using a computer.

2. The method of claim 1, wherein the step of shifting the first plurality of circuit regions comprises widening the cut lines to generate widened cut lines, and wherein the space comprises a portion of widened cut lines.

3. The method of claim 2, wherein the cut lines comprise a first cut line extending in a first direction, and a second cut line extending in a second direction perpendicular to the first direction, and wherein in the step of blowing up the first IP, the first IP is blown up in both the first direction and the second direction.

4. The method of claim 1, wherein the first layout of the chip representation further comprises a second IP, and wherein the method further comprises:
generating additional cut lines overlapping, and extending out from, edges of the second IP;
widening the additional cut lines to generate widened additional cut lines; and
blowing up the second IP to overlap at least portions of the widened additional cut lines, wherein the second IP is blown up by a second ratio.

5. The method of claim 4, wherein the second ration ratio is different from the first ratio.

6. The method of claim 1 further comprising, after the step of shifting the plurality of circuit regions, compacting the first plurality of circuit regions.

7. The method of claim 6, wherein all circuit regions shifted in the step of shifting are compacted in a same direction.

8. The method of claim 6, wherein the cut lines only extend in a Y-direction, wherein in the step of blowing up the first IP, the first IP is blown up only in a X-direction, and wherein the method further comprises:
generating additional cut lines overlapping, and extending from, additional edges of the first blown IP, wherein the additional cut lines extend in the X-direction and divide the chip representation into a second plurality of circuit regions;
shifting portions of the second plurality of circuit regions outward in the Y-direction relative to the first blown IP; and
blowing up the first blown IP in the Y-direction to generate a second layout of the chip representation.

9. The method of claim 8 further comprising performing a direct shrink on the second layout to generate a third layout of the chip representation.

10. The method of claim 9 further comprising implementing the third layout of the chip representation on a physical chip.

11. The method of claim 1, wherein the step of providing the first layout comprises retrieving the first layout from a storage media.

12. A method of forming an integrated circuit, the method comprising:
providing a first layout of a chip representation comprising a first intellectual property (IP);
generating cut lines overlapping, and extending from, edges of the first IP;
widening the cut lines to generate widened cut lines;
blowing up the first IP to overlap at least portions of the widened cut lines to generate a second layout of the chip representation, wherein the first IP is blown up by a first ratio; and
performing a direct shrinking on the second layout to generate a third layout, wherein the step of performing the direct shrinking is performed using a computer.

13. The method of claim 12, wherein the cut lines divide the chip representation into a plurality of circuit regions, and wherein in the step of widening the cut lines, the plurality of circuit regions are shifted to make space for the widened cut lines.

14. The method of claim 12, wherein the first IP is blown up to generate a blown IP, and wherein edges of the blown IP overlap respective outer edges of the widened cut lines.

15. The method of claim 12, wherein at least one of the cut lines extends from a first edge to a second edge of the chip representation, and wherein the first edge and the second edge are opposite edges of the chip representation.

16. The method of claim 12, wherein after the step of performing the direct shrinking, the first IP is shrunk to a same size as in the first layout.

17. The method of claim 12, wherein the first layout of the chip representation further comprises a second IP, and wherein the method further comprises:
generating additional cut lines overlapping, and extending out from, edges of the second IP;
widening the additional cut lines to generate widened additional cut lines; and
before the step of performing the direct shrinking, blowing up the second IP to overlap at least portions of widened additional cut lines to generate the second layout, wherein the second IP is blown up with a second ratio.

18. The method of claim 17, wherein the second ratio is different from the first ratio.

19. The method of claim 17, wherein the first IP and the second IP share a cut line.

20. The method of claim 17, wherein the first layout further comprises a third IP, and wherein the first IP shares a cut line with the second IP and the third IP.

21. The method of claim 17, wherein one of the additional cut lines comprises a first end joining an edge of the first IP.

22. The method of claim 21, wherein the one of the additional cut lines further comprises a second end reaching an edge of the chip representation.

23. A method of forming an integrated circuit, the method comprising:
providing a first layout of a chip representation comprising a first intellectual property (IP) and a second IP;
generating a first plurality of cut lines overlapping edges of the first IP and the second IP, wherein the first plurality of cut lines extends in a first direction and divides the chip representation into a first plurality of circuit regions;
shifting the first plurality of circuit regions in a second direction perpendicular to the first direction to space the first plurality of circuit regions apart;
blowing up the first IP and the second IP in the second direction and not in the first direction to generate a first blown IP and a second blown IP, respectively, wherein the step of blowing up the first IP and the second IP is performed using a computer;

compacting the first blown IP, the second blown IP, and the first plurality of circuit regions in the second direction to generate a second layout;

generating a second plurality of cut lines in the second layout and overlapping additional edges of the first blown IP and the second blown IP, wherein the second plurality of cut lines extends in the second direction, and wherein the second plurality of cut lines divides the second layout into a second plurality of circuit regions;

shifting the second plurality of circuit regions in the first direction to space the second plurality of circuit regions apart;

blowing up the first blown IP and the second blown IP in the first direction and not in the second direction to generate a third blown IP and a fourth blown IP, respectively;

compacting the third blown IP, the fourth blown IP, and the second plurality of circuit regions in the first direction to generate a third layout; and shrinking the third layout to generate a fourth layout.

24. The method of claim 23 further comprising implementing the fourth layout on a physical chip.

25. The method of claim 23, wherein a size of the first blown IP has a first ratio to a size of the first IP, and a size of the second blown IP has a second ratio to a size of the second IP, and wherein the first ratio is different from the second ratio.

26. The method of claim 23, wherein at least one of the first plurality of cut lines overlaps an edge of the second IP and ends at the first IP.

\* \* \* \* \*